(12) United States Patent
Sung

(10) Patent No.: US 10,403,547 B2
(45) Date of Patent: Sep. 3, 2019

(54) STRUCTURE AND METHOD OF FORMING SELF ALIGNED CONTACTS IN SEMICONDUCTOR DEVICE

(71) Applicant: Varian Semiconductor Equipment Associates, Inc., Gloucester, MA (US)

(72) Inventor: Min Gyu Sung, Essex, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/944,027

(22) Filed: Apr. 3, 2018

(65) Prior Publication Data

US 2019/0181047 A1     Jun. 13, 2019

Related U.S. Application Data

(60) Provisional application No. 62/597,842, filed on Dec. 12, 2017.

(51) Int. Cl.
| H01L 21/8234 | (2006.01) |
| H01L 29/78 | (2006.01) |
| H01L 21/02 | (2006.01) |
| B82Y 40/00 | (2011.01) |

(52) U.S. Cl.
CPC ........ *H01L 21/823431* (2013.01); *H01L 21/02019* (2013.01); *H01L 29/785* (2013.01); *B82Y 40/00* (2013.01)

(58) Field of Classification Search
CPC ....... H01L 21/823431; H01L 21/02019; H01L 29/785; B82Y 40/00

IPC ............... H01L 21/823431,21/02019, 29/785; B82Y 40/00
See application file for complete search history.

(56) References Cited

U.S. PATENT DOCUMENTS

| 6,576,519 B1* | 6/2003 | Houston ........... H01L 21/32139 257/E21.314 |
| 6,806,178 B2* | 10/2004 | Segawa ............. H01L 21/28052 257/E21.199 |
| 8,436,404 B2* | 5/2013 | Bohr ................. H01L 21/76831 257/288 |
| 8,946,828 B2* | 2/2015 | Sun ................... H01L 21/76834 257/288 |
| 9,466,722 B2* | 10/2016 | Liu ................. H01L 21/823425 |
| 9,601,587 B2* | 3/2017 | Sun ................... H01L 21/76834 |

(Continued)

*Primary Examiner* — John P. Dulka

(57) ABSTRACT

A method includes providing a transistor structure, comprising a semiconductor fin and a plurality of gate structures, disposed on the semiconductor fin, forming an insulator layer on the transistor structure, and performing a lithographic process including an overlay shift, comprising defining a set of openings to be formed in the insulator layer. The set of openings define a shift in a first direction with respect to a midpoint between adjacent gate structures of the plurality of gate structures. The method includes etching the insulator layer using the plurality of openings, to form a trench region between a pair of adjacent gate structures, wherein a source/drain region between the pair of adjacent gate structures is exposed. The method includes performing an angled deposition of a dielectric coating, wherein the dielectric coating forms a coating on a first side of the trench, and not on a second side of the trench region.

19 Claims, 7 Drawing Sheets

(56) References Cited

U.S. PATENT DOCUMENTS

| | | | |
|---|---|---|---|
| 2009/0057730 A1* | 3/2009 | Furukawa | H01L 21/76829 257/288 |
| 2009/0236664 A1* | 9/2009 | Brown | H01L 21/0206 257/347 |
| 2017/0110569 A1* | 4/2017 | Chang | H01L 21/76807 |
| 2018/0130889 A1* | 5/2018 | Xie | H01L 21/31051 |

* cited by examiner

STRUCTURE AND METHOD OF FORMING SELF ALIGNED CONTACTS IN SEMICONDUCTOR DEVICE

RELATED APPLICATIONS

This Application claims priority to US. Provisional patent application No. 62/597,842, entitled STRUCTURE AND METHOD OF FORMING SELF-ALIGNED CONTACTS IN SEMICONDUCTOR DEVICE, filed Dec. 12, 2017, and incorporated by reference herein in its entirety.

FIELD

The present embodiments relate to semiconductor device structures, and more particularly, to structures and processing for memory devices including dynamic random access devices.

BACKGROUND

As semiconductor devices, including logic devices and memory devices, scale to smaller dimensions, device patterning increasingly limits the ability to harness the improvements potentially resulting from smaller size. For example, three-dimensional semiconductor transistors, such as fin type field effect transistors (finFET) impose severe geometrical constraints for forming contacts to the source/drain (S/D) region of a transistor. Some current techniques for forming finFET exhibit a small process window for forming a self-aligned contact to the source/drain region. In known finFET devices using replacement gate scheme, for example, shorting of a S/D contact to a given transistor gate may take place because of the inherent gate height variation between different transistors distributed across a semiconductor substrate (wafer). One cause of this variation may be the multiple chemical mechanical polish (CMP) operations, such as four or more CMP operations, used to form replacement gate transistors. While the use of a narrower S/D contact between adjacent gate structures may tend to lessen the chance of exposing a transistor gate during CMP or other processing, this approach generates smaller contact area and thus higher contact resistance in the transistor device.

With respect to these and other considerations, the present disclosure is provided.

BRIEF SUMMARY

In one embodiment, a method for forming a semiconductor device, may include providing a transistor structure, where the transistor structure includes a semiconductor fin and a plurality of gate structures, disposed on the semiconductor fin. The method may include forming an insulator layer on the transistor structure, and performing a lithographic process including an overlay shift. The overlay shift overlay shift may involve defining a set of openings to be formed in the insulator layer, where the set of openings defines a shift in a first direction with respect to a midpoint between adjacent gate structures of the plurality of gate structures. The method may further include etching the insulator layer using the plurality of openings, to form a trench region between a given pair of adjacent gate structures, wherein a source/drain region between the given pair of adjacent gate structures is exposed. The method may also include performing an angled deposition of a dielectric coating, wherein the dielectric coating forms a coating on a first side of the trench, along a first gate structure, and does not form a coating on a second side of the trench region opposite the first side, along a second gate structure.

In another embodiment, a device structure may include a fin disposed in a substrate, the substrate defining a substrate plane, and may further include a plurality of gate structures, disposed on the fin, wherein a pair of adjacent gate structures of the plurality of gate structures defines a trench region. The trench region may include a source/drain region, disposed along a lower surface of the trench region; a first side, disposed along a first gate structure of the pair of adjacent gate structures; and a second side, disposed along a second gate structure of the pair of adjacent gate structures. The pair of adjacent gate structures may define a midpoint, wherein the trench region comprises a trench middle, and wherein the trench middle is shifted from the midpoint by an overlay shift towards the second side.

In another embodiment, a device structure may include a first gate structure and a second gate structure, spaced apart from the first gate structure. The device structure may further include a trench region disposed between the first gate structure and the second gate structure. The trench region may include a source/drain region, disposed along a lower surface of the trench region, a first side, disposed along the first gate structure, and a second side, disposed along the second gate structure. The first gate structure and the second gate structure may define a midpoint, wherein the trench region comprises a trench middle, and wherein the trench middle is shifted from the midpoint by an overlay shift towards the second side.

DETAILED DESCRIPTION

Figure 1:
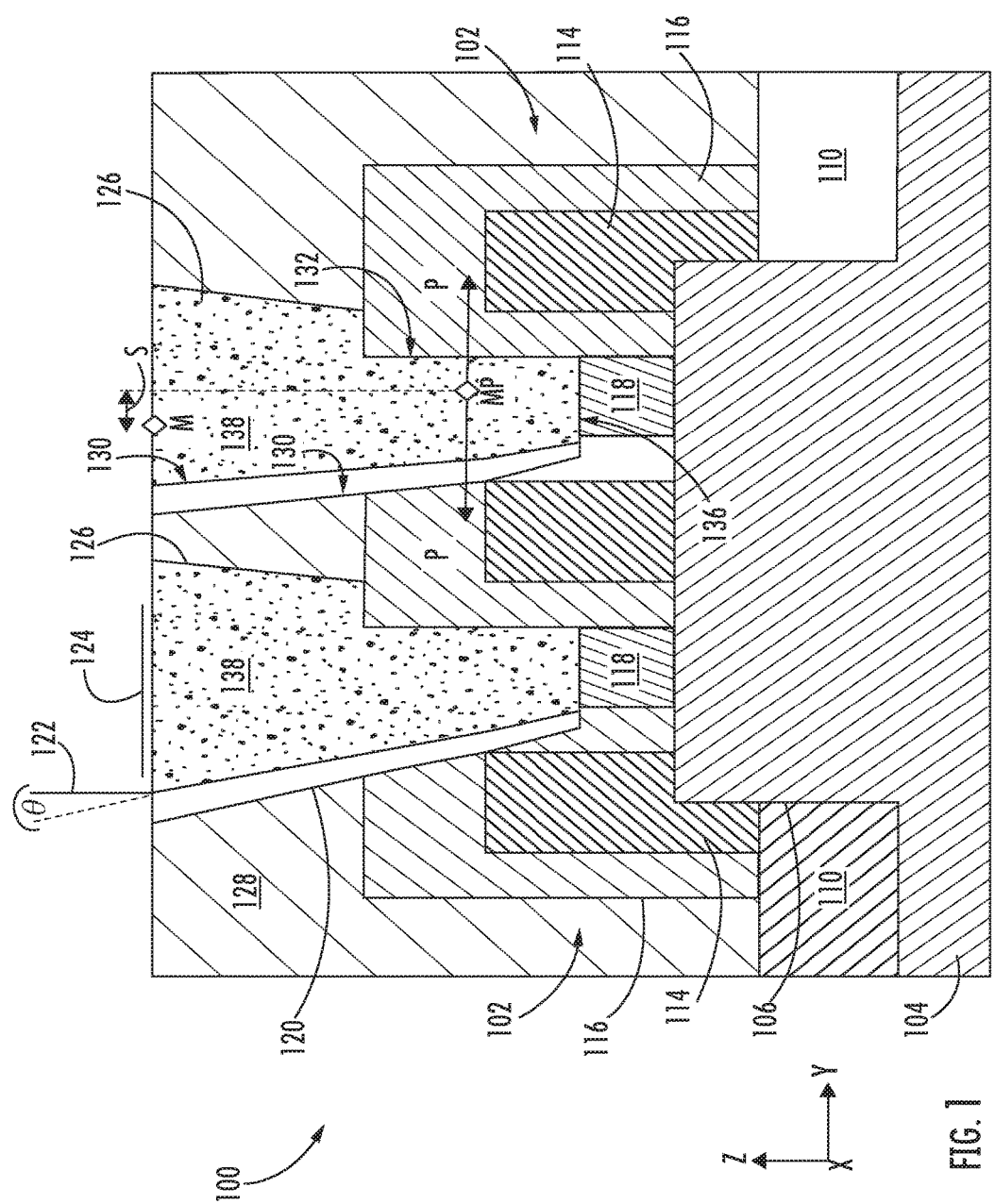
FIG. 1 shows a side cross-sectional view of a device structure, according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, including three dimensional transistors, formed in a semiconductor substrate. As is known, three dimensional transistors, such as finFETs may be arranged in circuitry to form various types of logic devices, as well as memory devices.

Turning now to FIG. 1 there is shown a side cross-sectional view of a device structure 100, in accordance with embodiments of the disclosure. The device structure 100 illustrates several components of a three-dimensional transistor arrangement, based upon a finFET transistor device. In known finFET devices, multiple gate structures may be formed over a semiconductor fin, where at least one gate structure forms a transistor gate of an active transistor. In the view of FIG. 1, a semiconductor fin 106 is disposed on or within a substrate 104, and may be partially covered with isolation oxide 110, as in known finFETs. For example, the semiconductor fin 106 may be integrally formed within a semiconductor wafer, such as silicon where the substrate plane (wafer plane) is coincident with the X-Y plane shown.

As shown in FIG. 1, a given gate structure includes a gate 114 and sidewall layer 116. The gate 114 may include known portions, including gate insulator, and at least one gate conductor, such as a metal or doped semiconductor. The gate insulator may be a known material, including silicon nitride or similar material. A given pair of adjacent gates structures, shown as gate structure 102, define a trench region 138, extending between a gate structure 102, more to the left, and a gate structure 102, more to the right. In this example the trench region 138 is filled with a contact metal 126, such as tungsten. The trench region 138 includes a source/drain region 118, disposed along a lower surface 136 of the trench region 138, a first side (right side in the view of FIG. 1), disposed along a first gate structure of the pair of adjacent gate structures, and a second side (the left side in FIG. 1), disposed along a second gate structure of the pair of adjacent gate structures. The trench region 138 may be generally asymmetrically disposed with respect to the pair of adjacent gate structures. For example, a given pair of adjacent gate structures (see the center gate structure and right gate structure) defines a midpoint MP (shown also be diamond symbol), while the trench region 138 comprises a trench middle M (also denoted by a diamond symbol). Notably, the trench middle M is shifted from the midpoint MP along a first direction (parallel to the Y-axis) by an overlay shift, shown as S. The overlay shift in FIG. 1 is towards the second side, meaning the left side in the figure. As detailed below, this architecture provides various advantages over known finFET structures.

As also shown in FIG. 1, the source/drain region 118 may be formed of epitaxial semiconductor forming a raised source/drain structure, formed on the semiconductor fin 106. In other embodiments, the source/drain region 118 may be formed directly in a semiconductor fin, not including any epitaxial region (raised source/drain region).

In addition to the asymmetry of the trench region 138, a hallmark of the device structure 100 is the inclusion of a dielectric coating 120, formed along the second side of a given trench structure. The dielectric coating 120 represents an additional insulator layer, formed in addition to the sidewall layer 116. As detailed below, the presence of the dielectric coating 120, in conjunction with the overlay shift S, may help ensure reliability of multiple transistor devices formed within a substrate. As also shown in FIG. 1, the device structure 100 further includes an insulator layer 128, such as an interlevel dielectric material. The insulator layer 128 may be formed of a different material as compared to the material of dielectric coating 120. As shown, the dielectric coating 120 is disposed between the contact metal 126 and the gate 114. The presence of the dielectric coating 120 thus prevents electrical shorting between the gate 114 and contact metal 126, along the left side of a given trench region (trench region 138) in the view of FIG. 1.

While in some embodiments, the dielectric coating 120 may have a coating surface extending along a perpendicular to the substrate plane (X-Y plane), in some embodiments, the surface of the dielectric coating 120 may extend at a non-zero angle of inclination, shown as θ, with respect to a perpendicular 122 to the substrate plane 124.

As regards the right side of a given trench region, electrical shorting is prevented by the presence of the sidewall layer 116. Because the middle M of the trench region 138 is shifted to the left (along the Y-axis) with respect to midpoint MP, the sidewall layer 116 may be thicker or more well preserved along the first side (right side) of a given trench structure, as compared to known finFET structures, where a trench region is generally aligned with the midpoint between adjacent gate structures.

By way of background, current self-aligned contact (SAC) processes for forming transistor devices, including logic devices, may exhibit a statistical variation in placement of trenches formed for source/drain contacts, where slight variation in position to the left or right (in the sense of FIG. 1) may cause exposure of a gate 114. Thus, when a trench region, such as trench region 138, is filled with a conductive contact (such as metal), an electrical short to the gate may occur. The architecture of FIG. 1 addresses this problem by deliberately shifting a trench region 138 away from the sidewall of one gate structure, accordingly preventing shorting to the left sides of gates 114. While a portion of sidewall layer 116 may be removed from the right side of a gate 114 to form a trench region 138, and may otherwise expose the right side of gate 114, the presence of the dielectric coating 120 prevents electrical shorting that may otherwise occur.

Figure 2A:
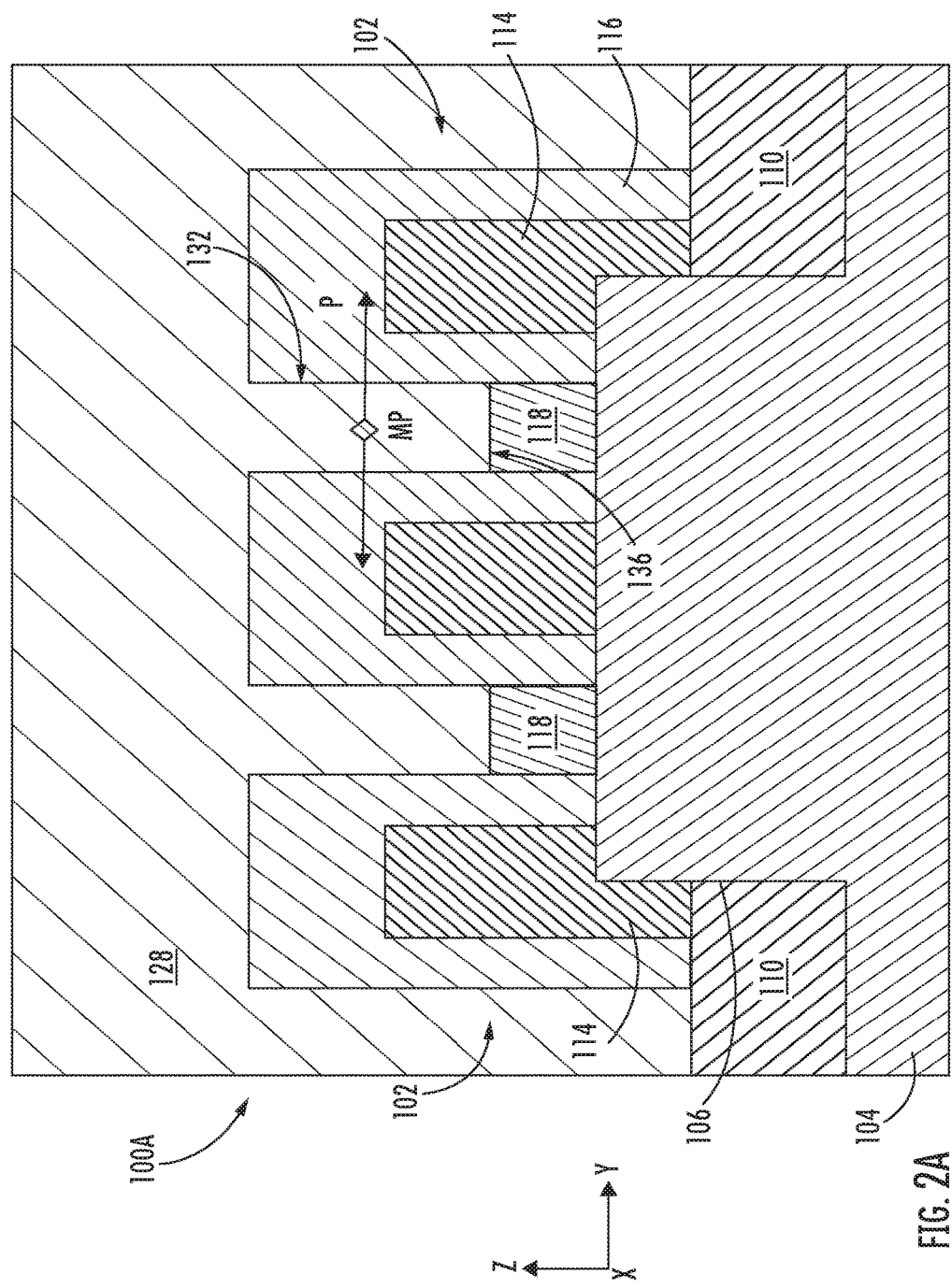
FIGS. 2A-2D shows a side cross-sectional view of a device structure, at different stages of fabrication, according to embodiments of the disclosure.

FIGS. 2A-2D shows a side cross-sectional view of a device structure, at different stages of fabrication, according to embodiments of the disclosure. The device structure 100, shown in FIG. 1, is denoted at different stages by a suffix, such as device structure 100A. FIG. 2A shows an instance during the formation where the device structure 100A represents a device structure similar to known finFET structures, after formation of gates and a source drain region, and before formation of contacts to the source/drain region.

As such, the device structure 100A includes a transistor structure including the semiconductor fin 106 and a plurality of gate structures, gate structures 102, disposed on the semiconductor fin 106. In various embodiments, a gate height of adjacent gate structures of the plurality of gate structures has a value between 40 nm and 100 nm, and a spacing between the adjacent gate structures has a value between 10 nm and 40 nm. The embodiments are not limited in this context. In some embodiments, a ratio of the gate height to the spacing between adjacent gate structures is at least 2, meaning the trenches have a high aspect ratio.

An insulator layer 128 has been formed on the transistor structure, extending between and above gate structures 102. The insulator layer 128 may be a silicon oxide material according to some embodiments. According to the present embodiments, the insulator layer 128 may be a different material from the material of sidewall layer 116. The insulator layer 128 may extend above the gate structures 102 by 10 nm to 50 nm in some embodiments, and in particular embodiments by 30 nm.

Figure 2B:
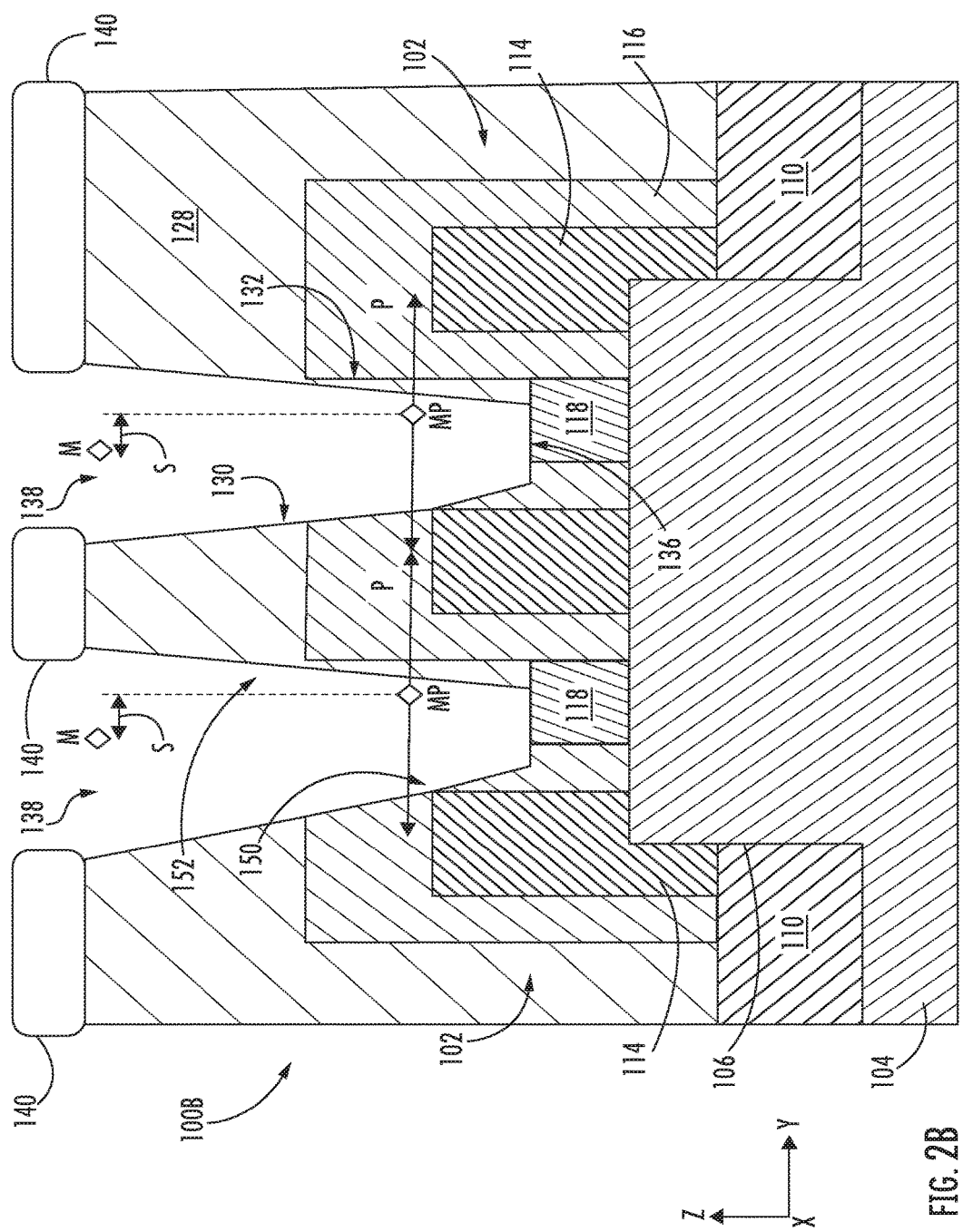

Turning now to FIG. 2B, there is shown a subsequent instance, wherein a lithographic process has been performed, including an overlay shift, where the overlay shift involves defining a set of openings to be formed in the insulator layer 128. As such, the lithographic process may employ known techniques such as ultraviolet lithography, in conjunction with provision of a mask layer to define the openings in the mask layer. The mask layer, including the set of openings, may be aligned with the pattern of the underlying gate structures so the set of openings define a shift in a first direction (to the left in FIG. 2B) with respect to a midpoint MP between adjacent gate structures of the plurality of gate structures. Subsequently, the operation of etching the insulator layer 128 using the plurality of openings in the mask layer is performed. The etching of insulator layer 128 may be performed using known etching techniques including reactive ion etching or other technique, tending to etch the insulator layer 128 in an anisotropic manner. In this manner, a trench region 138 is formed between a given pair of adjacent gate structures, wherein the source/drain region 118 between the given pair of adjacent gate structures is exposed, as shown in FIG. 2B.

In various embodiments, the pitch P between gate structures 102 may be between 30 nm and 100 nm, while in some embodiments the pitch may be 60 nm. In some embodiments, the overlay shift S may be between 2 nm and 10 nm, and in some embodiments, may be 3 nm to 6 nm. The embodiments are not limited in this context.

Figure 2C:
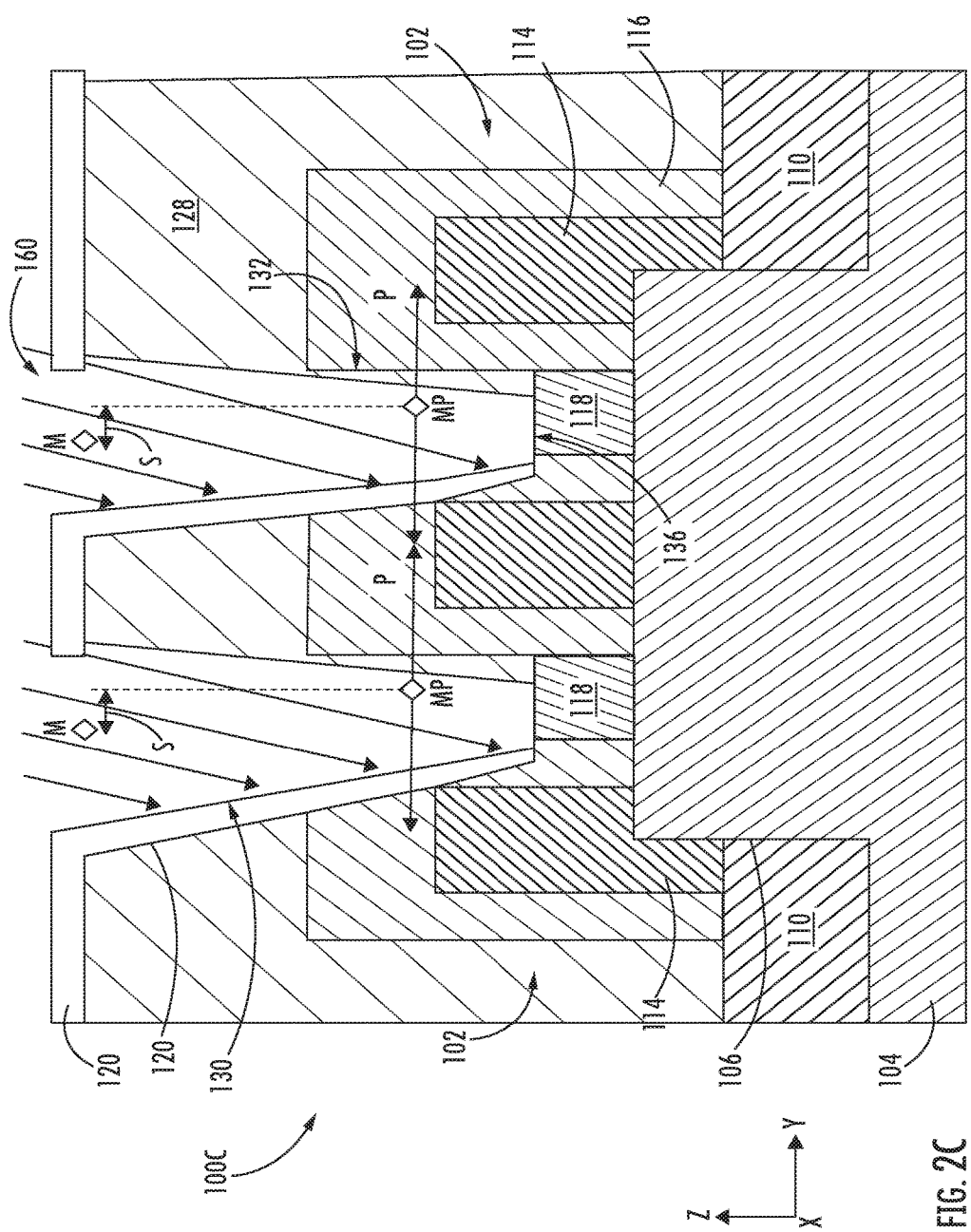

Turning now to FIG. 2C, there is shown a device structure 100C, after the performing of an angled deposition of a dielectric coating 120 using angled ions 160. As such, the dielectric coating 120 forms a coating on a first side 130 (left side) of the trench region 138, along a first gate structure, and does not form a coating on a second side 132 (right side) of the trench region 138 opposite the first side, along a second gate structure. In accordance with various embodiments, the thickness of the dielectric coating may be 3 nm or greater, helping to prevent electrical shorting between a gate and metal contact to be formed in the trench region 138. At the same time, the thickness of the dielectric coating 120 may be arranged so as not to overlap with the source/drain region 118. As such, the thickness of the dielectric coating 120 may be arranged in accordance with the overlay shift S. For example, an overlay shift S of 4 nm may accommodate a dielectric coating 120 of 3 nm-4 nm thickness, while not having the dielectric coating 120 overlap the source/drain region 118.

Figure 3A:
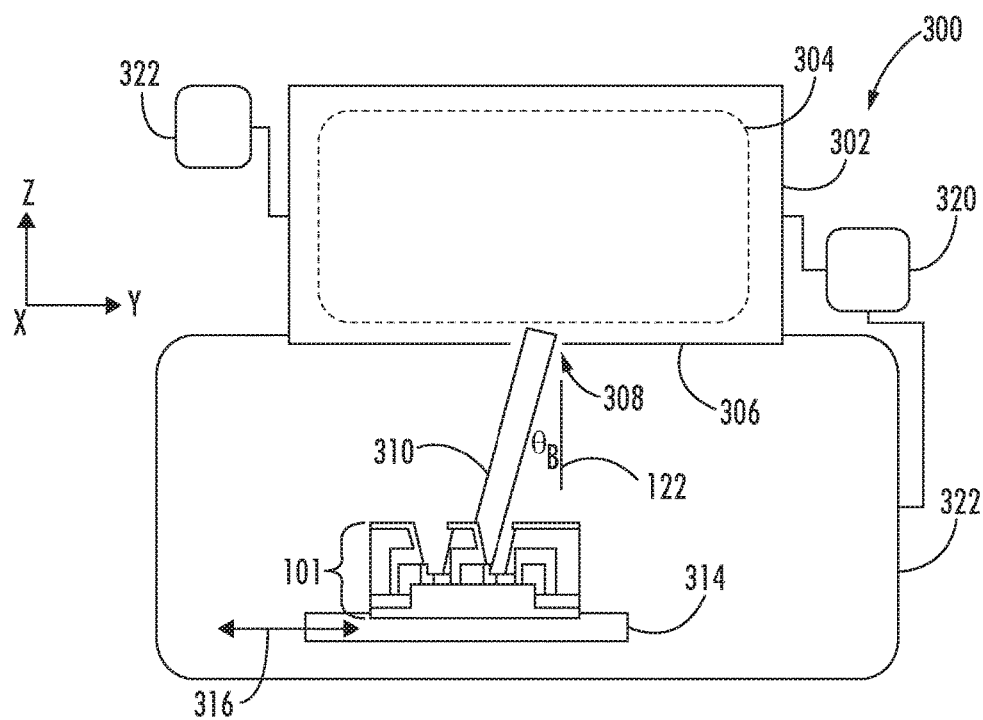
FIG. 3A and FIG. 3B shows use of an exemplary processing apparatus, in accordance with embodiments of the disclosure.

Turning now to FIG. 3A, there is shown a processing apparatus 300, depicted in schematic form. The processing apparatus 300 represents a processing apparatus for depositing a dielectric layer on a substrate, such as the dielectric coating 120. The processing apparatus 300 may be a plasma based processing system having a plasma chamber 302 for generating a plasma 304 therein by any convenient method as known in the art. An extraction plate 306 may be provided as shown, having an extraction aperture 308, where a selective etching may be performed to reactively etch an insulator layer with respect to a mask material. A substrate 101, such as a semiconductor wafer including, for example, the aforementioned structure, device structure 100, is disposed in the process chamber 322. A substrate plane of the substrate 101 is represented by the X-Y plane of the Cartesian coordinate system shown, while a perpendicular to the plane of the substrate 101 lies along the Z-axis (Z-direction).

During an angled reactive ion beam deposition operation, an ion beam 310 is extracted through the extraction aperture 308 as shown. As shown in FIG. 3A, the trajectory of the ion beam 310 forms a non-zero angle of incidence with respect to the perpendicular 122, shown as OB. The trajectories of ions within the ion beam 310 may be mutually parallel to one another or may lie within a narrow angular range, such as within 10 degrees of one another or less. Thus, the value of OB may represent an average value of incidence angle where the individually trajectories vary up to several degrees from the average value. The ion beam 310 may be extracted when a voltage difference is applied using bias supply 320 between the plasma chamber 302 and substrate 101 as in known systems. The bias supply 320 may be coupled to the process chamber 322, for example, where the process chamber 322 and substrate 101 are held at the same potential. In various embodiments, the ion beam 310 may be extracted as a continuous beam or as a pulsed ion beam as in known systems. For example, the bias supply 320 may be configured to supply a voltage difference between plasma chamber 302 and process chamber 322, as a pulsed DC voltage, where the voltage, pulse frequency, and duty cycle of the pulsed voltage may be independently adjusted from one another.

Figure 3B:
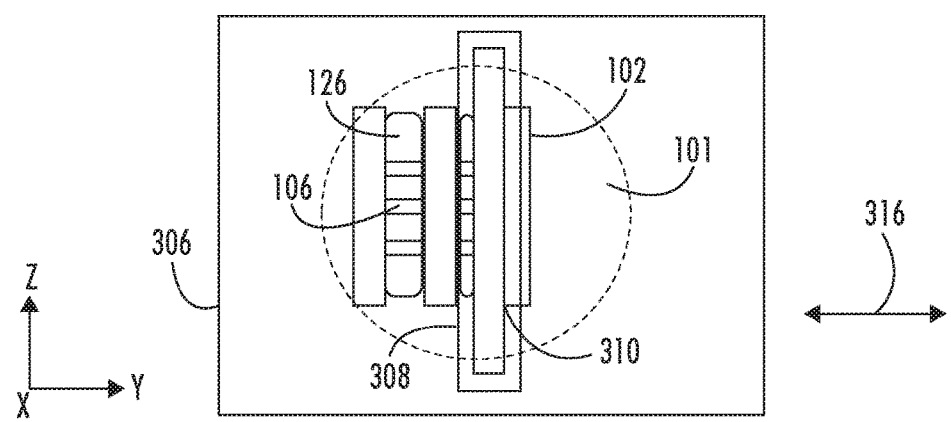

In various embodiments, for example, the ion beam 310 may be provided as a ribbon ion beam having a long axis extending along the X-direction of the Cartesian coordinate system shown in FIG. 3B. As shown, the rows of gate structures may be displaced in the X-Y plane along the X-axis, while the long dimension of semiconductor fins 106 is aligned along the Y-axis. The projection in the X-Y plane of the trajectories of ions of the ion beam 310 is to the left in FIG. 3B, wherein the ions of ion beam 310 impinge upon the left side of trench regions 138. By scanning a substrate stage 314 including substrate 101 with respect to the extraction aperture 308, and thus with respect to the ion beam 310, along the scan direction 316, the ion beam 310 may deposit a set of dielectric coatings on the left side of all given trench regions oriented in the manner depicted in the figures. The ion beam 310 may be composed of any convenient gas mixture, including inert gas, reactive gas, and may be provided in conjunction with other gaseous species in some embodiments. In particular embodiments, the ion beam 310 and other reactive species may be provided as a reactive deposition recipe to the substrate 101 so as to perform a directed reactive deposition of targeted portions of a given trench region. Such a deposition recipe may use known reactive deposition chemistries for depositing materials such as oxide, nitride or other material, as known in the art. Examples of suitable materials for deposition include silicon nitride, titanium oxide, aluminum oxide, or hafnium oxide. The embodiments are not limited in this context. Generally, the material of insulator layer 128 may differ from the material of dielectric coating 120.

In this example of FIG. 3B, the substrate 101 is a circular wafer, such as a silicon wafer, the extraction aperture 308 is an elongated aperture, having an elongated shape. The ion beam 310 is provided as a ribbon ion beam extending to a beam width along the X-direction, where the beam width is adequate to expose an entire width of the substrate 101, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 3B, the substrate 101 may be scanned in the scan direction 316, where the scan direction 316 lies in the X-Y plane, such as along the Y-direction. Notably, the scan direction 316 may represent the scanning of substrate 101 in two opposing (180 degrees) directions along the Y-direction, or just a scan toward the left or a scan toward the right. As shown in FIG. 3B, the long axis of ion beam 310 extends along the X-direction, perpendicularly to the scan direction 316. Accordingly, an entirety of the substrate 101 may be exposed to the ion beam 310 when scanning of the substrate 101 takes place along a scan direction 316 to an adequate length from a left side to right side of substrate 101 as shown in FIG. 3B. Accordingly, transistor structures across an entirety of a substrate 101 may be coated with a dielectric coating, just on one side of a trench region, where the side being coated represents the side of a trench is shifted away from the midpoint MP between adjacent gate structures.

Figure 2D:
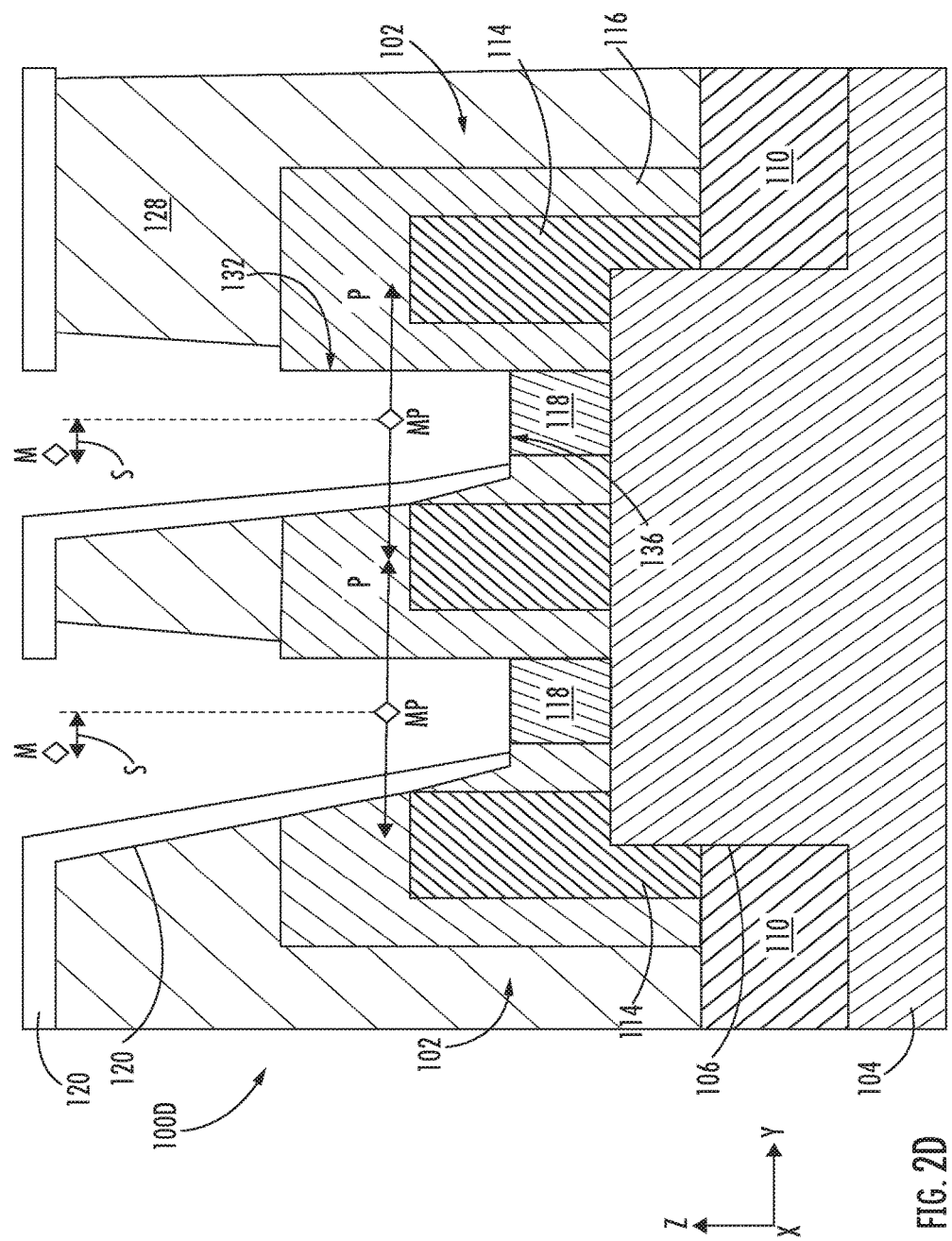

Turning to FIG. 2D, there is shown a device structure 100D after the performing of a wet etch to selectively remove the insulator layer 128 with respect to the dielectric coating 120, as well as material of the gate structure, such as the sidewall layer 116. For example, in embodiments where the insulator layer 128 is silicon oxide, the sidewall layer 116 is silicon nitride, and the dielectric coating is titanium dioxide, hafnium oxide, aluminum oxide, or silicon nitride, the wet etch may be an HF etch such as buffered HF (hydrofluoric acid). The wet etch may result in isotropic etching of the insulator layer 128, while not attacking substantially the sidewall layer 116 and dielectric coating 120. As such, dielectric material, meaning portions of the insulator layer 128, is removed from top surface of the source/drain region 118. For example, the insulator layer 128 may be etched with a selectivity of 10/1 or greater with respect to dielectric coating 120 and sidewall layer 116. Because the dielectric coating 120 also does not overlap the source/drain region 118, the top of the source/drain region 118 may be exposed in its entirety, providing a maximum surface for electrical contact with a contact metal to be formed in the trench region 138.

Subsequently to the instance of FIG. 2D, a contact metal may be formed in the trench region 138, leading to the structure of FIG. 1.

While the patterning of devices in FIG. 2A-2D is shown with respect to finFET-type devices, in other embodiments, the use of overlay shift and angled deposition of an insulator layer may be applied for contact trenches between adjacent gate structures in planar transistor devices. In such other devices, the source/drain region being contacted may lie just in the plane of the substrate (X-Y plane).

Figure 4:
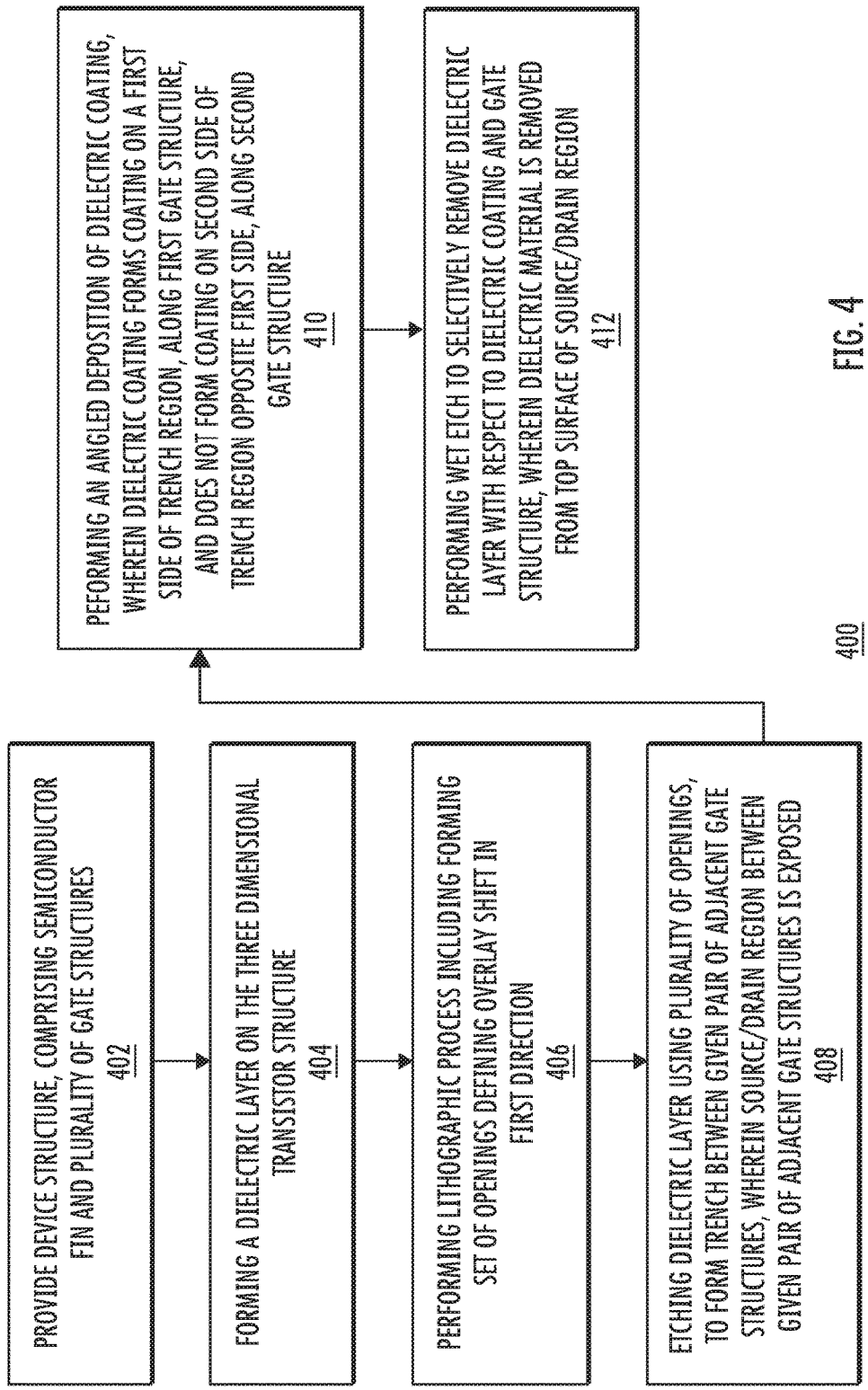
FIG. 4 shows an exemplary process flow, according to further embodiments of the disclosure.

FIG. 4 depicts an exemplary process flow 400, according to embodiments of the disclosure. At block 402, a device structure, such as a three-dimensional device structure, is provided, comprising a semiconductor fin and a plurality of gate structures. At block 404, a dielectric layer is formed on the three-dimensional transistor structure. At block 406, a lithographic process is performed including forming a set of openings defining an overlay shift in a first direction. At block 408, etching of the dielectric layer is performed using the plurality of openings, to form a trench between a given pair of adjacent gate structures, wherein a source/drain region between the given pair of adjacent gate structures is exposed. At block 410 an angled deposition of a dielectric coating is performed, wherein the dielectric coating forms a coating on a first side of the trench region, along first gate structure, and does not form a coating on a second side of trench region opposite the first side, along a second gate structure. At block 412 a wet etch is performed to selectively remove the dielectric layer with respect to the dielectric coating and the gate structure, wherein dielectric material is removed from the top surface of the source/drain region.

The present embodiments provide various advantages over known device structures. For one advantage, a much wider process window is enabled for forming self-aligned contact integration in a source/drain contact of a transistor, such as a finFET. Additional advantages include process window improvement without the penalty of shorting between gate to contact metal, and without loss of contact area to the source/drain region.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method for forming a semiconductor device, comprising
providing a transistor structure, the transistor structure comprising a semiconductor fin and a plurality of gate structures, disposed on the semiconductor fin;
forming an insulator layer on the transistor structure;
performing a lithographic process including an overlay shift, the overlay shift comprising defining a set of openings to be formed in the insulator layer, the set of openings defining a shift in a first direction with respect to a midpoint between adjacent gate structures of the plurality of gate structures;
etching the insulator layer using the set of openings, to form a trench region between a given pair of adjacent gate structures, wherein a source/drain region between the given pair of adjacent gate structures is exposed; and
performing an angled deposition of a dielectric coating, wherein the dielectric coating forms a coating on a first side of the trench, along a first gate structure, and does not form a coating on a second side of the trench region opposite the first side, along a second gate structure.

2. The method of claim 1, wherein the insulator layer comprises a silicon oxide material, the method further comprising: performing a wet etch to selectively remove the insulator layer with respect to the dielectric coating and the gate structure, wherein the silicon oxide material is removed from a top surface of the source/drain region.

3. The method of claim 1, wherein the dielectric coating comprises silicon nitride, aluminum oxide, hafnium oxide or titanium oxide.

4. The method of claim 1, wherein the plurality of gate structures comprises a first spacing, and the overlay shift comprises a first shift, wherein the first spacing has a value between 10 nm and 100 nm, and wherein the first shift has a value between 2 nm and 10 nm.

5. The method of claim 1, wherein a gate height of adjacent gate structures of the plurality of gate structures has a value between 40 nm and 100 nm, and wherein a spacing between the adjacent gate structures has a value between 10 nm and 40 nm.

6. The method of claim 5, wherein a ratio of the gate height to the spacing between adjacent gate structures is at least 2.

7. The method of claim 1, wherein the dielectric coating comprises a thickness of 3 nm or greater, and wherein the dielectric coating does not overlap the source/drain region.

8. The method of claim 1, wherein the transistor structure is disposed in a substrate, the substrate defining a substrate plane, and wherein the performing the angled deposition comprises directing an ion beam at a non-zero angle of incidence with respect to a perpendicular to the substrate plane, the ion beam comprising depositing species for forming the dielectric coating.

9. The method of claim 8, wherein the substrate is disposed in a process chamber during the performing the angled deposition of the dielectric coating, and wherein the directing the ion beam further comprises:
extracting the ion beam from a plasma chamber into the process chamber, through an extraction aperture, wherein the ion beam forms a trajectory defining the non-zero angle of incidence with respect to the substrate plane; and
performing at least one scan wherein the substrate is scanned with respect to the extraction aperture when the substrate is exposed to the ion beam.

10. A device structure, comprising:
a fin disposed in a substrate, the substrate defining a substrate plane; and
a plurality of gate structures, disposed on the fin,
wherein a pair of adjacent gate structures of the plurality of gate structures defines a pitch and further defines a trench region, wherein the trench region comprises:
a source/drain region, disposed along a lower surface of the trench region;
a first side, disposed along a first gate structure of the pair of adjacent gate structures; and
a second side, disposed along a second gate structure of the pair of adjacent gate structures, wherein the pair of adjacent gate structures defines a midpoint, wherein the trench region comprises a trench middle, wherein the trench middle is shifted from the midpoint by an overlay shift towards the second side, and wherein a ratio of the overlay shift to the pitch ranges between 2/100 to ⅓.

11. The device structure of claim 10, comprising:
wherein the first side comprises a sidewall layer, the sidewall layer covering a gate conductor of the first gate structure; and
wherein the second side comprises a dielectric coating, the dielectric coating having a coating surface extending at a non-zero angle of inclination with respect to a perpendicular to the substrate plane.

12. The device structure of claim 11, wherein the sidewall layer comprises silicon nitride.

13. The device structure of claim 11, wherein the dielectric coating comprises silicon nitride, aluminum oxide, hafnium oxide or titanium oxide.

14. The device structure of claim 11, wherein the device structure further comprises a contact metal, disposed in the trench region, the contact metal forming an interface with the source/drain region, wherein the gate sidewall and the dielectric coating do not cover the source/drain region.

15. The device structure of claim 11, wherein the dielectric coating comprises a coating thickness of 3 nm or more.

16. The device structure of claim 10, wherein the pitch has a value between 40 nm and 100 nm.

17. The device structure of claim 16, wherein the overlay shift has a value between 2 nm and 10 nm.

18. A device structure, comprising:
a first gate structure;
a second gate structure, spaced apart from the first gate structure, the first gate structure and second gate structure defining a pitch; and
a trench region disposed between the first gate structure and the second gate structure, wherein the trench region comprises:
a source/drain region, disposed along a lower surface of the trench region;
a first side, disposed along the first gate structure; and
a second side, disposed along the second gate structure, wherein the first gate structure and the second gate structure define a midpoint, wherein the trench region comprises a trench middle, wherein the trench middle is shifted from the midpoint by an overlay shift towards the second side, and wherein a ratio of the overlay shift to the pitch ranges between 2/100 to ⅓.

19. The device structure of claim 18,
wherein the first side comprises a sidewall layer, the sidewall layer covering a gate conductor of the first gate structure, and
wherein the second side comprises a dielectric coating, the dielectric coating having a coating surface extending at a non-zero angle of inclination with respect to a perpendicular to the substrate plane,
the device structure further comprising a contact metal, disposed in the trench region, the contact metal forming an interface with the source/drain region, wherein the gate sidewall and the dielectric coating do not cover the source/drain region.

* * * * *